(12) United States Patent
Wen et al.

(10) Patent No.: US 12,087,080 B2
(45) Date of Patent: Sep. 10, 2024

(54) DISPLAY PANEL

(71) Applicant: WUHAN CHINA STAR OPTOELECTRONICS TECHNOLOGY CO., LTD., Wuhan (CN)

(72) Inventors: Wanglin Wen, Wuhan (CN); Fei Ai, Wuhan (CN); Yong Xu, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/419,621

(22) PCT Filed: May 24, 2021

(86) PCT No.: PCT/CN2021/095382
§ 371 (c)(1),
(2) Date: Nov. 17, 2022

(87) PCT Pub. No.: WO2022/236867
PCT Pub. Date: Nov. 17, 2022

(65) Prior Publication Data
US 2024/0013568 A1 Jan. 11, 2024

(30) Foreign Application Priority Data
May 11, 2021 (CN) .......................... 202110513060.3

(51) Int. Cl.
*G06V 40/13* (2022.01)
*H01L 25/16* (2023.01)
*H01L 27/146* (2006.01)

(52) U.S. Cl.
CPC ...... *G06V 40/1318* (2022.01); *G06V 40/1306* (2022.01); *H01L 25/167* (2013.01); *H01L 27/14636* (2013.01); *H01L 27/14643* (2013.01)

(58) Field of Classification Search
CPC ............ G06V 40/1318; G06V 40/1306; H01L 25/167; H01L 27/14636; H01L 27/14643
See application file for complete search history.

(56) References Cited

U.S. PATENT DOCUMENTS

2011/0121723 A1* 5/2011 Chen ...................... H01L 33/486
313/509
2018/0011353 A1* 1/2018 Wang ................... G02B 6/0025
(Continued)

FOREIGN PATENT DOCUMENTS

CN 108710237 A 10/2018
CN 108735786 A 11/2018
(Continued)

OTHER PUBLICATIONS

Chinese Office Action in corresponding Chinese Patent Application No. 202110513060.3 dated May 25, 2022, pp. 1-7.
(Continued)

*Primary Examiner* — Antonio Xavier
(74) *Attorney, Agent, or Firm* — PV IP PC; Wei Te Chung (57) ABSTRACT

A display panel and a manufacturing method thereof are provided. A fingerprint recognition module and a storage capacitor of the display panel are disposed in a thin-film transistor (TFT) device layer. The fingerprint recognition module is electrically connected to an active layer and the storage capacitor of a TFT by an electrode layer, thereby optimizing a structure of an array substrate. Furthermore, the display panel can better receive reflected light signals and has improved fingerprint recognition performance. The dis-
(Continued)

play panel has a simple manufacturing process and low manufacturing costs.

16 Claims, 8 Drawing Sheets

(56) References Cited

U.S. PATENT DOCUMENTS

| | | | |
|---|---|---|---|
| 2018/0033835 A1 | 2/2018 | Zeng et al. | |
| 2019/0067385 A1 | 2/2019 | Xu et al. | |
| 2019/0130153 A1* | 5/2019 | Hu | H04M 1/185 |
| 2020/0212081 A1* | 7/2020 | Liu | H01L 27/1461 |
| 2021/0133418 A1 | 5/2021 | Liu et al. | |
| 2022/0149202 A1* | 5/2022 | Takechi | H01L 27/1251 |

FOREIGN PATENT DOCUMENTS

| | | |
|---|---|---|
| CN | 109299708 A | 2/2019 |
| CN | 109686808 A | 4/2019 |
| CN | 109858443 A | 6/2019 |
| CN | 110265457 A | 9/2019 |
| CN | 110632781 A | 12/2019 |
| CN | 110931522 A | 3/2020 |
| CN | 112133199 A | 12/2020 |
| CN | 112259556 A | 1/2021 |
| WO | 2020238313 A1 | 12/2020 |

OTHER PUBLICATIONS

Notification to Grant Patent Right for Invention issued in corresponding Chinese Patent Application No. 202110513060.3 dated Jul. 22, 2022, pp. 1-4.
International Search Report in International application No. PCT/CN2021/095382, mailed on Dec. 24, 2021.
Written Opinion of the International Searching Authority in International application No. PCT/CN2021/095382, mailed on Dec. 24, 2021.

* cited by examiner

DISPLAY PANEL

RELATED APPLICATIONS

This application is a Notional Phase of PCT Patent Application No. PCT/CN2021/095382 having international filing date of May 24, 2021, which claims the benefit of priority of Chinese Patent Application No. 202110513060.3 filed on May 11, 2021. The contents of the above applications are all incorporated by reference as if fully set forth herein in their entirety.

FIELD

The present disclosure relates to the field of display technologies, and more particularly, to a display panel.

BACKGROUND

With continuous development of display technologies, types of display panels have been more and more diverse. A display quality and a display effect of display devices have also been continuously improved.

Light-emitting diode (LED) display devices have been widely used in various display devices. To improve a luminous effect and performance of LEDs, mini-LEDs and micro-LEDs are used commonly. A size of micro-LEDs is smaller than a size of mini-LEDs. Therefore, micro-LEDs are more suitable for wearable applications. By matrixing and miniaturizing micro-LEDs, chips are densely arranged inside display panels. Then, the LED array is transferred to a circuit board inside the display panels by a massive transfer method. Therefore, LEDs can emit light. However, in conventional technologies, many technical problems occur during a process of manufacturing micro-LED display panels. A size and a shape of micro-LEDs are small, while a number of LEDs installed inside the display panels is massive. Therefore, an array substrate in the display panels must appropriately correspond to massive micro-LEDs when massive micro-LEDs are transferred inside the display panels. Furthermore, not only should the LEDs in the display panels be ensured to emit light normally, but also a display effect and a display quality should be ensured. Moreover, manufacturing processes also need to be simplified. Certain technical difficulties need to be overcome to achieve the above goals.

Therefore, it is necessary to provide solutions to solve problems of conventional technologies.

Regarding the technical problems: in manufacturing processes of conventional micro-LED display panels, an array substrate in the display panels must appropriately correspond to massive micro-LEDs when massive micro-LEDs are transferred inside the display panels. A luminescent function and a fingerprint recognition function need to be ensured. A display quality and touch control performance need to be improved. Certain technical difficulties need to be overcome to achieve the above goals.

SUMMARY

To solve the above problems, an embodiment of the present disclosure provides a display panel to improve a structure of the display panel. Therefore, micro-LEDs can better match the display panel, and a display quality of the display panel is improved. In addition, manufacturing processes are simplified, and therefore costs of the manufacturing processes are reduced.

The solve the above technical problems, solutions provided by an embodiment of the present disclosure are as follows.

In a first aspect of an embodiment of the present disclosure, a display panel is provided. The display panel comprises:
- a thin-film transistor (TFT) device layer, wherein the TFT device layer comprises a source, a drain, a gate, and an active layer of a TFT;
- a planarization layer, wherein the planarization layer is disposed on the TFT device layer;
- a first electrode layer, wherein the first electrode layer is disposed on the planarization layer; and
- a storage capacitor, wherein the storage capacitor is disposed on a side of the TFT device layer;
- wherein the display panel further comprises a fingerprint recognition module, the fingerprint recognition module comprises a sensing electrode layer, the sensing electrode layer and the active layer are disposed on a same layer, the storage capacitor is electrically connected to the fingerprint recognition module by the first electrode layer, a material of the first electrode layer is indium tin oxide (ITO), and the fingerprint recognition module comprises at least one of a light fingerprint recognition device or an ultrasonic fingerprint recognition device.

According to one embodiment of the present disclosure, the display panel further comprises a second electrode layer and a first through-hole, the first through-hole is defined on a layer corresponding to the storage capacitor, and the second electrode layer is disposed in the first through-hole.

According to one embodiment of the present disclosure, an end of the second electrode layer is electrically connected to the first electrode layer, and another end of the second electrode layer is electrically connected to an electrode of the storage capacitor.

According to one embodiment of the present disclosure, the storage capacitor comprises a first metal layer and a second metal layer which are disposed on different layers, and a projection of the first metal layer overlaps with a projection of the second metal layer.

According to one embodiment of the present disclosure, the first metal layer and the gate of the TFT transistor are formed by a same etching process.

According to one embodiment of the present disclosure, the display panel further comprises a light-enhancing layer, and the light-enhancing layer is surrounding the fingerprint recognition module.

According to one embodiment of the present disclosure, the fingerprint recognition module further comprises a photosensitive electrode layer, an end of the photosensitive electrode layer is connected to the first electrode layer, and another end of the photosensitive electrode layer is connected to the sensing electrode layer.

According to a second aspect of an embodiment of the present disclosure, a display panel is provided. The display panel comprises:
- a thin-film transistor (TFT) device layer, wherein the TFT device layer comprises a source, a drain, a gate, and an active layer of a TFT;
- a planarization layer, wherein the planarization layer is disposed on the TFT device layer;
- a first electrode layer, wherein the first electrode layer is disposed on the planarization layer; and
- a storage capacitor, wherein the storage capacitor is disposed on a side of the TFT device layer;
- wherein the display panel further comprises a fingerprint recognition module, the fingerprint recognition module comprises a sensing electrode layer, the sensing electrode layer and the active layer are disposed on a same layer, the storage capacitor is electrically connected to the fingerprint recognition module by the first electrode layer.

According to one embodiment of the present disclosure, the display panel further comprises a second electrode layer and a first through-hole, the first through-hole is defined on a layer corresponding to the storage capacitor, and the second electrode layer is disposed in the first through-hole.

According to one embodiment of the present disclosure, an end of the second electrode layer is electrically connected to the first electrode layer, and another end of the second electrode layer is electrically connected to an electrode of the storage capacitor.

According to one embodiment of the present disclosure, the storage capacitor comprises a first metal layer and a second metal layer which are disposed on different layers, and a projection of the first metal layer overlaps with a projection of the second metal layer.

According to one embodiment of the present disclosure, the first metal layer and the gate of the TFT are formed by a same etching process.

According to one embodiment of the present disclosure, the display panel further comprises a light-enhancing layer, and the light-enhancing layer is surrounding the fingerprint recognition module.

According to one embodiment of the present disclosure, the fingerprint recognition module further comprises a photosensitive electrode layer, an end of the photosensitive electrode layer is connected to the first electrode layer, and another end of the photosensitive electrode layer is connected to the sensing electrode layer.

According to one embodiment of the present disclosure, the photosensitive electrode layer comprises a first photosensitive electrode, a second photosensitive electrode, and a connecting layer, the first photosensitive electrode is disposed on the connecting layer, and the second photosensitive electrode is disposed on the first photosensitive electrode, the first photosensitive electrode is electrically connected to the sensing electrode layer by the connecting layer, and the second photosensitive electrode is electrically connected to the first electrode layer.

According to one embodiment of the present disclosure, a width of the connecting layer is less than a width of the first photosensitive electrode, and the width of the first photosensitive electrode is less than or equal to a width of the second photosensitive electrode.

According to one embodiment of the present disclosure, the sensing electrode layer is formed from the active layer.

According to one embodiment of the present disclosure, the active layer comprises a lightly doped region and a heavily doped region adjacent to the lightly doped region, and the active layer corresponding to the heavily doped region forms the sensing electrode layer.

According to one embodiment of the present disclosure, the display panel further comprises a third electrode layer and a second through-hole, and the third electrode layer is electrically connected to the drain of the TFT by the second through-hole.

According to one embodiment of the present disclosure, the display panel further comprises a light-emitting diode (LED) disposed on the planarization layer and connected to the third electrode layer.

Regarding the Beneficial Effects a display panel and a manufacturing method thereof are provided. A fingerprint recognition module is disposed in an array substrate of the display panel. A through-hole structure is formed on layers corresponding to the fingerprint recognition module. The finger recognition module provided by an embodiment of the present disclosure is disposed in a thin-film transistor (TFT) layer of the display panel, thereby optimizing a structure of the display panel. Furthermore, the finger recognition module of an embodiment of the present disclosure can better receive reflected optical signals and has a strong anti-interference capability. In addition, it has good fingerprint recognition performance, simple manufacturing processes, and low manufacturing costs.

DESCRIPTION OF DRAWINGS

FIGS. 1A to 10 are structural schematic views showing an array substrate of a fingerprint recognition panel provided by an embodiment of the present disclosure.

DETAILED DESCRIPTION

Description of following embodiments refers to attached drawings to illustrate specific embodiments that the present disclosure can be implemented.

With continuous improvement of manufacturing technologies of micro-LED display panels, structures, performances, and manufacturing methods of display panels have also been better required to continuously improve comprehensive performance of the display panels. Embodiments of the present disclosure provide a display panel and a manufacturing method thereof to continuously improve a display quality and fingerprint recognition performance of the display panel. Manufacturing processes of the display panel are simplified, and manufacturing costs are reduced.

Figure 1A:
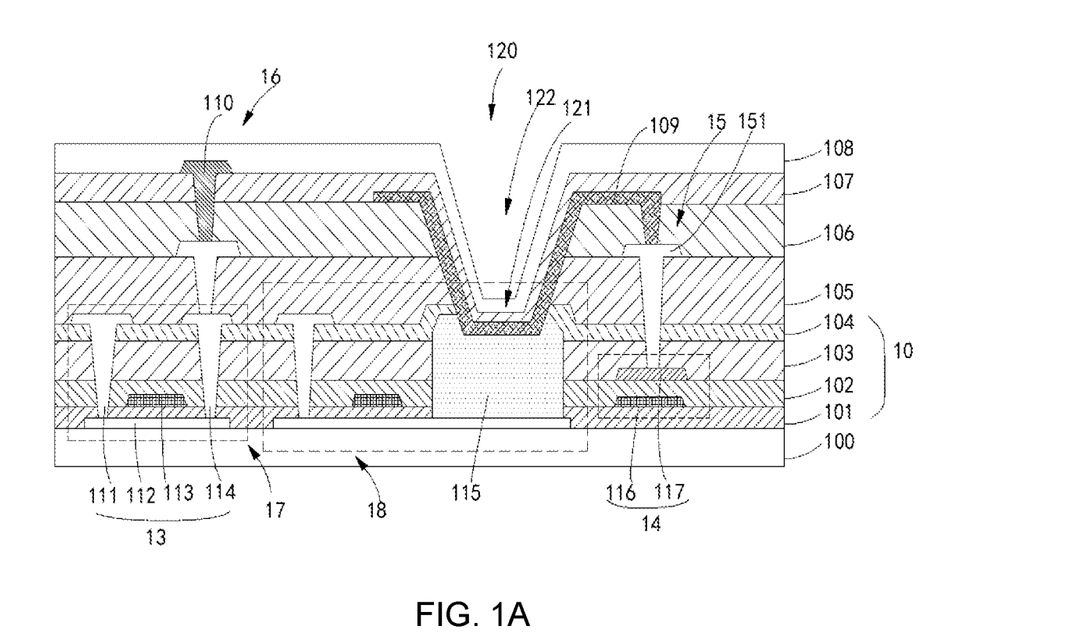

As shown in FIG. 1A, FIG. 1A is a structural schematic view showing an array substrate of a fingerprint recognition panel provided by an embodiment of the application. The display panel includes a base substrate 100 and a thin-film transistor (TFT) device layer 10.

Specifically, at least two TFTs are disposed in the TFT device layer 10. In present the embodiment, a second TFT 17 and a first TFT 18 are taken as an example for description. The second TFT 17 and the first TFT 18 may be disposed adjacent to each other.

In present embodiment, the TFT device layer 10 further includes an active layer 112, a first gate insulating layer 101, a first metal layer 116, a second gate insulating layer 102, a second metal layer 117, an inorganic insulating layer 103, and a passivation layer 104 of a TFT.

Wherein, the active layer 112 is disposed on the base substrate 100. After the active layer 112 is disposed on the base substrate 100, the active layer 112 is patterned and etched. Finally, the active layer 112 as shown in FIG. 1A is formed. In the present embodiment, a length of the active layer 112 corresponding to the second TFT 17 may not be greater than a length of the active layer 112 corresponding to the first TFT 18.

Furthermore, the first gate insulating layer 101 is disposed on the active layer 112 and covers the active layer 112, and the first metal layer 116 is disposed on the first gate insulating layer 101. In the present embodiment, the first metal layer 116 may include a metal gate 113 of the TFT. The gate 113 is correspondingly disposed in an area above the active layer 112 of the second TFT 17 and the first TFT 18.

The second metal layer 117 is disposed on the second gate insulating layer 102. In the present embodiment, a storage capacitor 14 is disposed on a side of the first TFT 18. A top electrode and a bottom electrode of a storage capacitor 14 is formed of the first metal layer 116 and the second metal layer 117. That is, the first metal layer 116 may also include the bottom electrode plate of the storage capacitor 14. In the present embodiment, the second metal layer 117 is disposed on a side of the first TFT 18. To ensure performance of the storage capacitor 14, when the first metal layer 116 and the second metal layer 117 are disposed, the first metal layer 116 is disposed in a position corresponding to an orthographic projection of the second metal layer 117 on the base substrate 100.

The first metal layer 116 and the second metal layer 117 can have equal length. Alternatively, at least one of the first metal layer 116 or the second metal layer 117 is completely disposed in an orthographic projection area of the other one in a vertical direction. That is, a projection of the first metal layer 116 and a projection the second metal layer 117 on an interlayer dielectric layer may overlap with each other, ensuring that the storage capacitor has better performance. Furthermore, when the storage capacitor 14 is disposed, the first metal layer 116 and the second metal layer 117 are respectively disposed on two different interlayer dielectric film layers.

In the present embodiment, when the first metal layer 116 and the metal gate 113 of the first TFT 18 or the metal gate 113 of the second TFT 17 are formed, the first metal layer 116 and the metal gate 113 can be formed at a same time, and they can be etched in a single process. Finally, the first metal layer 116 and the metal gate 113 are obtained. Moreover, the first metal layer 116 is formed by the gate 113 of the first TFT 18 or the gate 113 of the second TFT 17. Preferably, the first metal layer 116 and the metal gate 113 can be made of a same material. The first metal layer 116 and the metal gate 113 are disposed on a same layer. During manufacturing processes, the first metal layer 116 can be directly obtained from the gate of the TFT, thereby simplifying the manufacturing processes and optimizing a film structure in the display panel.

The inorganic insulating layer 103 is disposed on the second metal layer 117 and covers the second metal layer 117. After the inorganic insulating layer 103 is formed, the passivation layer 104 is sequentially deposited on the inorganic insulating layer 103.

In the present embodiment, a fingerprint recognition module 115 is further disposed on the TFT device layer 10. The fingerprint recognition module 115 is disposed on the active layer 112 of the TFT. The fingerprint recognition module 115 further includes a sensing electrode layer. The sensing electrode layer and the active layer 112 can be disposed on a same layer and can be made of a same material. That is, the sensing electrode layer and the active layer are a same film layer. Therefore, only the active layer 112 is shown in following drawings, and the sensing electrode layer is not specifically labeled. Furthermore, the storage capacitor 14 is disposed on a side of the fingerprint recognition module 115. Specifically, the fingerprint recognition module 115 is disposed on the active layer 112 of the first TFT 18. An end of the fingerprint recognition module 115 is electrically connected to the active layer 112, and another end of the fingerprint recognition module 115 is connected to the first electrode layer 109. The fingerprint recognition module 115 is disposed in a position corresponding to a third through-hole 121.

The fingerprint recognition module 115 of the present embodiment further includes a photosensitive electrode layer. Specifically, the photosensitive electrode layer is disposed on the active layer 112. An end of the photosensitive electrode layer is connected to the first electrode layer 109, and another end of the photosensitive electrode layer is connected to the active layer. Since the active layer 112 and the sensing electrode layer are the same film layer, the first electrode layer 109, the fingerprint recognition module 115, and the sensing electrode layer together form a PIN junction diode structure. The sensing electrode layer is an N layer of the PIN junction diode. Since the active layer 112 and the sensing electrode layer are the same film layer, the active layer 112 of the TFT is also the N layer of the PIN junction diode. Furthermore, the display panel provided by the present embodiment includes a first planarization layer 105 and a second planarization layer 106. The second planarization layer 106 is disposed on the first planarization layer 105. In the present embodiment, the first TFT 18 is mainly configured to drive the fingerprint recognition module. Furthermore, in the first TFT 18, only one of a source or a drain is disposed. The second TFT 17 is mainly a driving TFT. The second TFT 17 lights up LEDs.

In the present embodiment, the display panel is further provided with a first electrode layer 109, wherein the first electrode layer 109 is mainly disposed in a fingerprint recognition area 120 of the display panel. In the fingerprint recognition area 120, the corresponding passivation layer 104, film layers of the first planarization layer 105, and film layers the second planarization layer 106 are provided with a fourth through-hole 122. The first electrode layer 109 is provided along the inner wall of the fourth through-hole 122, and an edge area of two ends of the first electrode layer 109 is disposed outside the fourth through-hole 122. Moreover, part of the first electrode layer 109 is disposed in the third through-hole 121. The first electrode layer 109 and the fingerprint recognition module 115 are electrically connected to each other in the third through-hole 121.

In the present embodiment, a first through-hole 15 is also defined in the display panel. Specifically, the first through-hole 15 is defined on a film structure corresponding to the storage capacitor 14. The first through-hole 15 penetrates the inorganic insulating layer 103, the passivation layer 104, the first planarization layer 105, and the second planarization layer 106. Preferably, a thickness of the first planarization layer 105 may be greater than a thickness of the second planarization layer 106, so that the fingerprint recognition module 115 can be disposed in the first planarization layer. Furthermore, a second electrode layer 151 is provided with the first through-hole 15. The second electrode layer 151 can extend from the storage capacitor 14 to the first planarization layer 105.

Furthermore, the first electrode layer 109 is electrically connected to the second electrode layer 151 by the first through-hole 15, so that an end of the second electrode layer 151 is connected to the storage capacitor 14, and another end of the second electrode layer 151 is electrically connected to the first electrode layer 109.

In the present embodiment, the first electrode layer 109 may be an indium tin oxide (ITO) film layer, and the second electrode layer 151 may be a drain of the first TFT 18. Therefore, an end of the first electrode layer 109 is connected to the first TFT 18. The drain of the first electrode layer 109 is also electrically connected to the fingerprint recognition module 115. Furthermore, a drain of the first TFT is connected to a top electrode plate of the storage capacitor 14. Therefore, when electric charges are changed in the fingerprint recognition module 115, they can be transferred to the storage capacitor 14 by the first electrode layer 109 and the drain of the first TFT 18. Therefore, the storage capacitor 14 can store the electric charges. Because of this configuration, it is not necessary to additionally disposed an electrode layer to transfer the electric charges generated by the fingerprint recognition module 115. The electric charges can be transferred by the drain of the first TFT 18, thereby effectively simplifying an electrode structure of the display panel.

In the present embodiment, a material of the first electrode layer 109 and a material of the second electrode layer 151 can be same, and a material of the first electrode layer 109 can be an ITO film layer. To ensure accuracy and efficiency of fingerprint recognition, it is preferable to dispose a transparent ITO film layer. Therefore, more light signals can enter the fingerprint recognition module 115, thereby improving recognition performance of the fingerprint recognition module and ensuring a display quality of the display panel.

When performing a fingerprint recognition, a fingerprint can be recognized in the fingerprint recognition area 120. Light signals reflected by the fingerprint will be received by the fingerprint recognition module 115. When the fingerprint recognition module 115 receives the light signals, it will change electric charges in the fingerprint recognition module 115. Because the fingerprint recognition module 115 is electrically connected to the storage capacitor 14 by the first electrode layer 109, the electric charges in the storage capacitor 14 change accordingly. The storage capacitor 14 can store electrical charges the fingerprint recognition module 115. Furthermore, the fingerprint recognition module 115 converts optical signals into electrical signals in the active layer 112, and then transmits the electrical signals. Finally, fingerprint recognition can be realized.

In the embodiment of the present disclosure, the fingerprint recognition module 115 may include a light fingerprint recognition device, an ultrasonic fingerprint recognition device, and other recognition devices which have light-sensing device, sound-sensing device, vibration-sensing device, or other sensing devices.

Furthermore, the display panel further includes a second through-hole 16. Specifically, the second through-hole 16 is defined on a film structure corresponding to the second TFT 17, wherein the second through-hole 16 penetrates the first planarization layer 105, the second planarization layer 106, and the second passivation layer 107. The second through-hole 16 exposes a drain 114 of the second TFT 17. A third electrode layer 110 is disposed in the second through-hole 16. The third electrode layer 110 can be entirely disposed in the second through-hole 16. In the present embodiment, the third electrode layer 110 can also be disposed in the second through-hole 16 in sections, thereby achieving a smoother transition and ensuring a connection quality. Therefore, performance of the devices is ensured. Wherein, a lower end of the third electrode layer 110 is electrically connected to the drain 114, and an upper end of the third electrode layer 110 is disposed on the second passivation layer 107.

In the present embodiment, when a great number of external LEDs is transferred onto the array substrate, a position corresponding to the third electrode layer 110 may be etched to define a hole. Therefore, the third electrode layer 110 is exposed and is correspondingly and electrically connected to the LEDs, thereby installing an LED device.

After the great number of LEDs is transferred, the LEDs are connected to a source or a drain of TFTs by the third electrode layer 110, so that LEDs are driven by corresponding TFTs to emit light. Furthermore, the fingerprint recognition module provided by the present embodiment can identify fingerprints, thereby realizing a recognition function of the display panel. Therefore, the display panel provided by the present embodiment can not only control light emission of the LEDs, but also realize fingerprint recognition of the display panel. Moreover, the display panel has a simpler structure and better performance.

Since the fourth through-hole 122 is defined in the fingerprint recognition area 120, loss of light in film layers is reduced, and more light reaches the fingerprint recognition module 115. Therefore, the fingerprint recognition module has a stronger anti-interference capability, thereby ensuring the display panel has better fingerprint recognition performance.

In the present embodiment, a material of the second electrode layer 151 and a material of the third electrode layer 110 may be same.

Figure 1B:
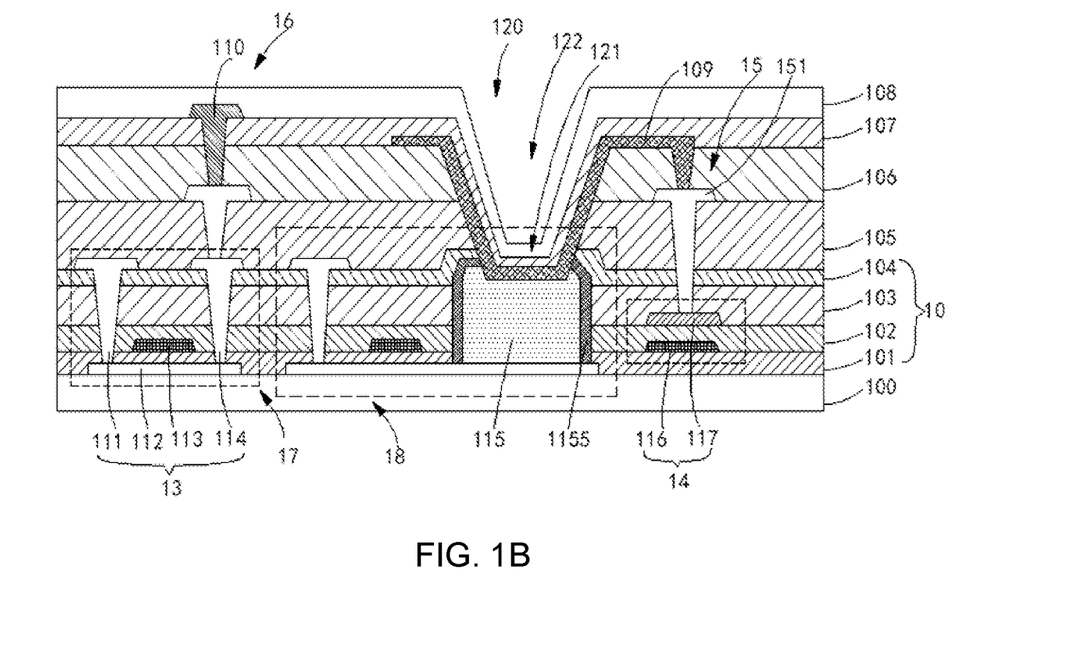

Furthermore, as shown in FIG. 1B, FIG. 1B is another structural schematic view showing the display panel provided by the present embodiment. To improve fingerprint recognition performance of the display panel, the display panel further includes a light-enhancing layer 1155. Wherein, the light-enhancing layer 1155 is disposed surrounding the fingerprint recognition module 115. That is, the light-enhancing layer 1155 is disposed around a periphery of the fingerprint recognition module 115. Specifically, a circle of the light-enhancing layer 1155 can be disposed.

The light-enhancing layer 1155 is closely attached to the fingerprint recognition module 115 and a side of a corresponding film layer at the same time. A height of the light-enhancing layer 1155 can be greater than a height of the fingerprint recognition module 115, thereby effectively covering the fingerprint recognition module 115.

Preferably, the light-enhancing layer 1155 can be made of a polymethyl methacrylate material or other thermoplastic polymer materials. When light passes through film layers and reaches the fingerprint recognition module 115, the fingerprint recognition module 115 can receive more light, thereby improving recognition performance of the fingerprint recognition module 115.

The light-enhancing layer 1155 of the present embodiment can also be disposed on the fingerprint recognition module 115, which is not described here in detail. The light-enhancing layer 1155 is arranged on different positions to enhance light transmittance, thereby effectively improving fingerprint recognition efficiency.

Figure 1C:
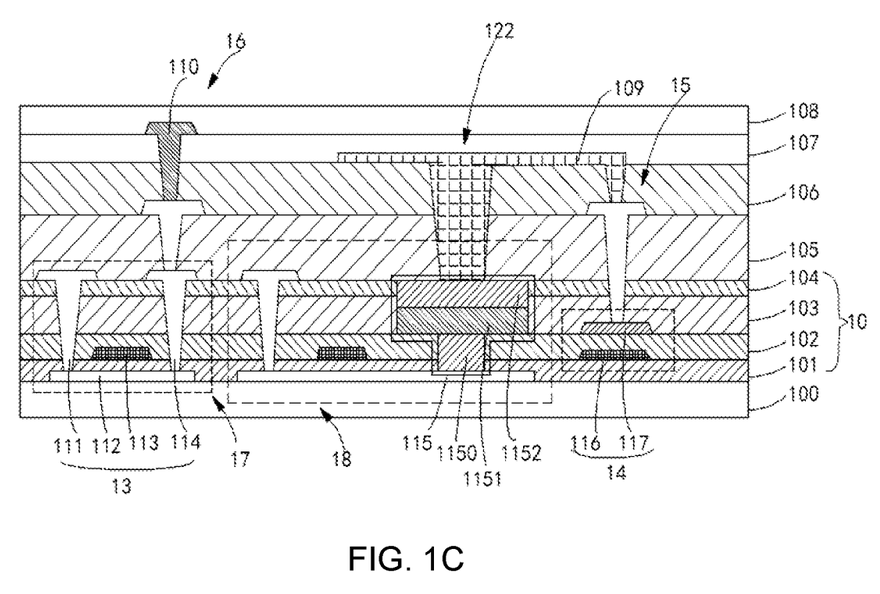

Preferably, as shown in FIG. 1O, FIG. 1C is another structural schematic view the display panel provided by the present embodiment. In conjunction with FIG. 1A, the fingerprint recognition module 115 of the present embodiment further includes a plurality of functional electrode layers. Specifically, the fingerprint recognition module 115 includes a first photosensitive electrode 1151, a second photosensitive electrode 1152, a connecting layer 1150, and a sensing electrode layer. Since the sensing electrode layer and the active layer 112 are a same film layer, the first photosensitive electrode 1151, the second photosensitive electrode 1152, the connection layer 1150, and the active layer 112 of the first TFT 18 form the fingerprint recognition module 115.

Wherein, the connecting layer 1150 is disposed on the active layer 112, the first photosensitive electrode 1151 is disposed on the connecting layer 1153, the second photosensitive electrode 1152 is disposed on the first photosensitive electrode 1151, and the first photosensitive electrode 1151 is electrically connected to the active layer 112 by the connecting layer 1150.

In the present embodiment, the second photosensitive electrode 1152 and the first photosensitive electrode 1151 may be a light-receiving layer of the recognition module. The second photosensitive electrode 1152 and the first photosensitive electrode 1151 are configured to increase an amount of light reaching the fingerprint recognition module 115. Optical signals are transmitted to the active layer 112 by the connecting layer 1150 to further improve recognition performance of the fingerprint recognition module 115. At the same time, the active layer 112 receives the optical signals of the first photosensitive electrode 1151 and the second photosensitive electrode 1152 and converts the optical signals into control signals.

The sensing electrode layer of the fingerprint recognition module 115 and the active layer 112 are a same film layer. The active layer 112 is a sensing electrode layer of the fingerprint recognition module 115. When light sequentially passes through the first photosensitive electrode 1151 and the second photosensitive electrode 1152 and reaches the sensing electrode layer that is the active layer 112, the active layer 112 converts light signals into control signals, thereby realizing a recognition function. Thus, a structure and manufacturing processes of the device are effectively simplified.

The active layer 112 of the present embodiment further includes a plurality of doped regions, such as an N ion-doped region and a P ion-doped region. Furthermore, the doped-areas include a lightly doped region and a heavily doped region adjacent to the lightly doped region. Wherein, the heavily doped region is arranged close to an edge of the active layer 112, and a channel area is arranged in a middle portion of the active layer 112. The lightly doped region and the heavily doped region on two sides are separated by the channel area. When forming the sensing electrode layer, the sensing electrode layer can be directly formed by the active layer corresponding to the heavily doped region.

When setting each functional electrode layer, preferably, a width of the connecting layer 1150 is less than a width of the first photosensitive electrode 1151, and a width of the first photosensitive electrode 1151 is less than or equal to a width of the second photosensitive electrode 1152. To further improve recognition performance of the fingerprint recognition module 115, when the second photosensitive electrode 1152 and the first photosensitive electrode 1151 are disposed, a width of the second photosensitive electrode 1152 and a width of the first photosensitive electrode 1151 can be same, thereby ensuring as much light as possible can reach the second photosensitive electrode 1152. Therefore, recognition performance is improved.

Since the connection layer 1150 of the present embodiment has a small width and is disposed on the active layer 112, a width of the active layer 112 of the second thin film transistor 17 is effectively reduced. Therefore, a width of the display panel is further reduced, which is beneficial for realizing a narrow-frame panel and reducing the manufacturing costs of products.

Preferably, when the first planarization layer 105 and the second planarization layer 106 are disposed, a thickness of the first planarization layer 105 is greater than a thickness of the second planarization layer 106, and the fingerprint recognition module 115 is disposed on the second planarization layer 106. The first planarization layer 105 and the second planarization layer 106 are disposed in corresponding openings. When the fingerprint recognition module 115 is disposed, a functional layer of the fingerprint recognition module 115 is directly disposed on the drain 114, and optical signals are directly transmitted to the active layer 112 by the drain 114. Therefore, a distance between the fingerprint recognition module 115 and the electrode layer 109 is effectively reduced. As a result, an amount of light reaching the fingerprint recognition module is increased, thereby effectively improving recognition performance of the fingerprint recognition module 115.

Figure 2:
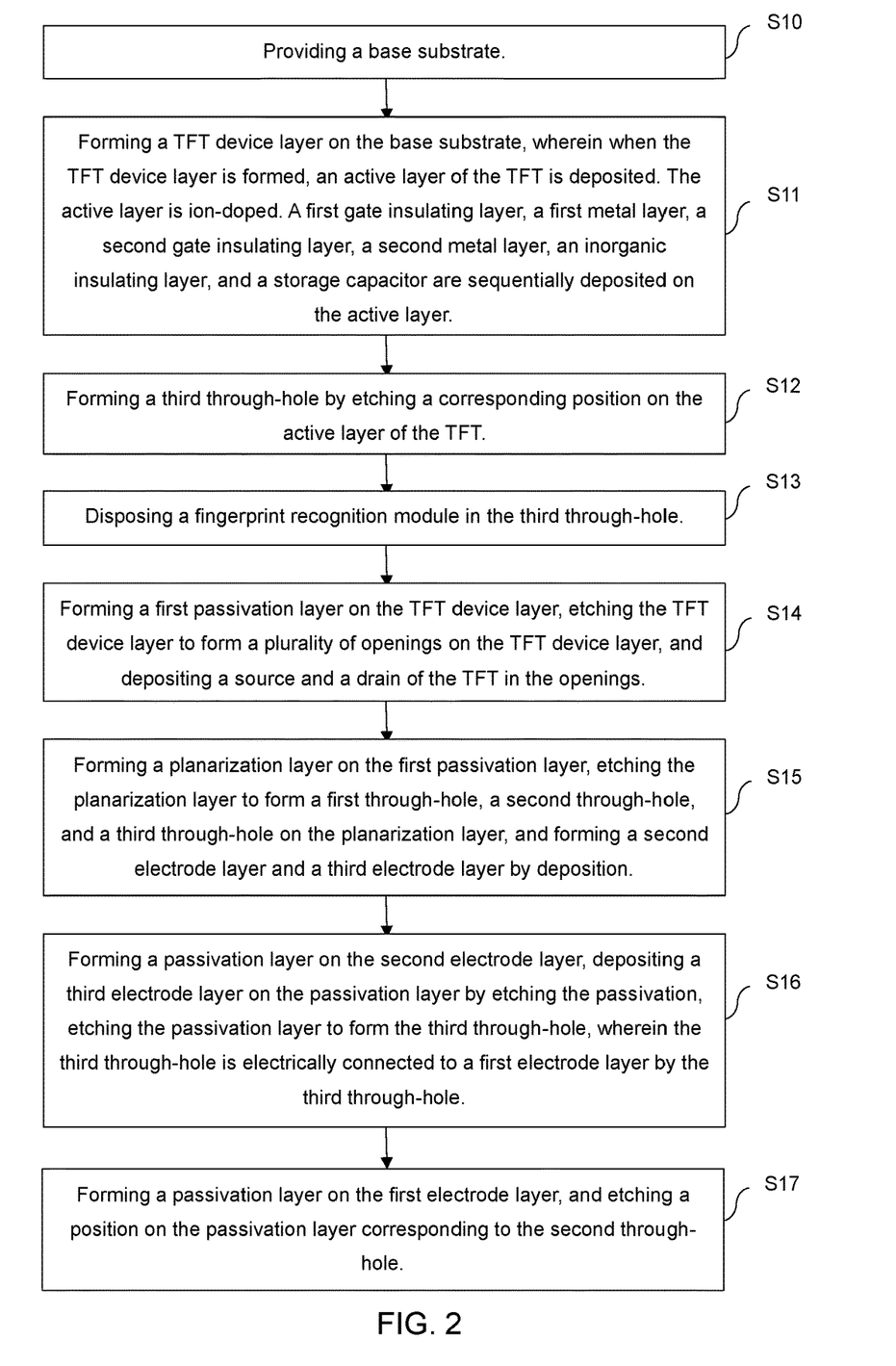
FIG. 2 is a schematic flowchart showing a manufacturing method of a display panel provided by an embodiment of the present disclosure.

Furthermore, an embodiment of the present disclosure further provides a method of manufacturing a display panel. Specifically, as shown in FIG. 2, FIG. 2 is a schematic flowchart showing a manufacturing process of the display panel provided by the present embodiment. The manufacturing process includes following steps:

S10: providing a base substrate;

S11: forming a TFT device layer on the base substrate, wherein when the TFT device layer is formed, an active layer of the TFT is deposited. The active layer is ion-doped. A first gate insulating layer, a first metal layer, a second gate insulating layer, a second metal layer, an inorganic insulating layer, and a storage capacitor are sequentially deposited on the active layer.

The display panel provided by the present embodiment has better fingerprint recognition performance. When the display panel of the embodiment is manufactured, a base substrate is deposited on the glass substrate. Specifically, the base substrate may include a buffer layer, such as a polyimide film layer. Specifically, a thickness of the polyimide film layer can be determined according to actual requirements.

Specifically, as shown in FIGS. 3 to 13, FIGS. 3 to 13 are schematic views showing corresponding film structures during the manufacturing process of the display panel provided by the present embodiment.

Figure 3:
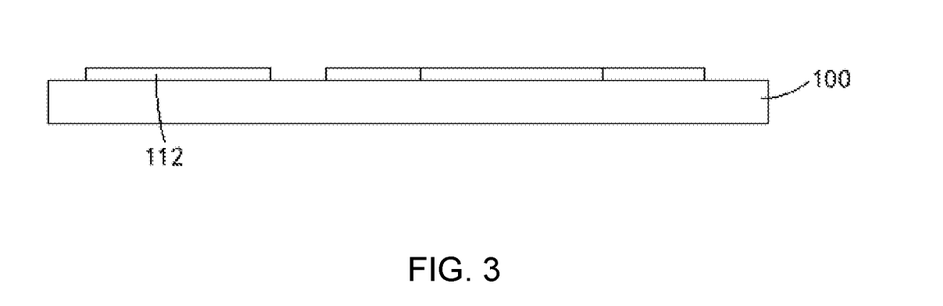
FIGS. 3 to 13 are structural schematic views showing corresponding layers of the manufacturing method of the display panel provided by an embodiment of the present disclosure.

In the manufacturing process of the display panel, the TFT device layer of the display panel is formed first. Specifically, as shown in FIG. 3, the active layer 112 of the TFT is deposited on the base substrate 100, and then the film layer is patterned to form a structure as shown in drawings. At the same time, film layers are ion-doped. During a doping process, N+ and P+ ions can be respectively doped into the active layer. After the doping process is completed, a lightly doped region and a heavily doped region can be formed. Wherein, the heavily doped region is defined near an edge of the active layer 112, a channel area is defined in a middle portion of the active layer, and the lightly doped region and the heavily doped region are separated by the channel area.

Figure 4:
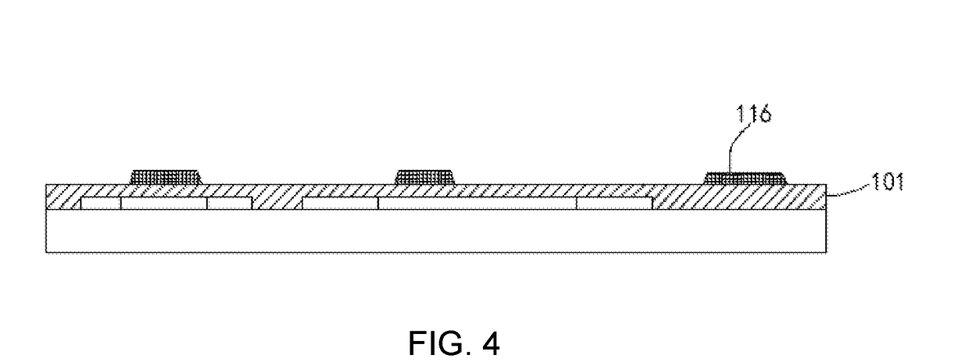

After the doping process is completed, as shown in FIG. 4, other film layers are deposited on the active layer 112. Specifically, the first gate insulating layer 101 is deposited on the active layer 112. Then, a first metal layer 116 is deposited on the first gate insulating layer 101. After the deposition of the first metal layer 116 is completed, the first metal layer 116 is patterned to form a film structure as shown in FIG. 4. In the present embodiment, the first metal layer 116 further includes a gate of a TFT.

S12: forming a third through-hole by etching a corresponding position on the active layer of the TFT;

S13: disposing a fingerprint recognition module in the third through-hole;

S14: forming a first passivation layer on the TFT device layer, etching the TFT device layer to form a plurality of openings on the TFT device layer, and depositing a source and a drain of the TFT in the openings.

Figure 5:
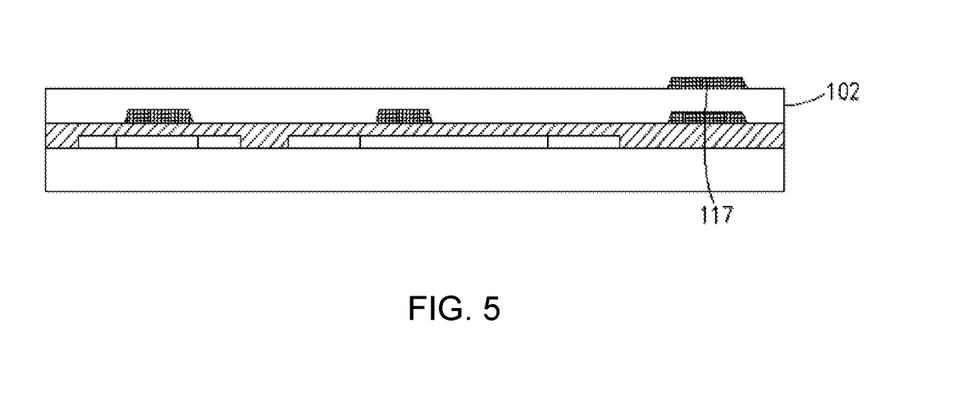

As shown in FIG. 5, film layers are further disposed on the first metal layer 116. Specifically, a second gate insulating layer 102 is deposited on the first metal layer 116 and covers the first metal layer 116. A second metal layer 117 is disposed on the second gate insulating layer 102, and the second metal layer 117 is patterned to form a film layer structure as shown in FIG. 4.

In the present embodiment, the second metal layer 117 is disposed on a side of the display panel and is opposite to the corresponding first metal layer 116. Furthermore, the first metal layer 116 and the second metal layer 117 form a storage capacitor structure. The first metal layer 116 is a bottom electrode of the storage capacitor, and the second metal layer 117 is a top electrode of the storage capacitor.

Figure 6:
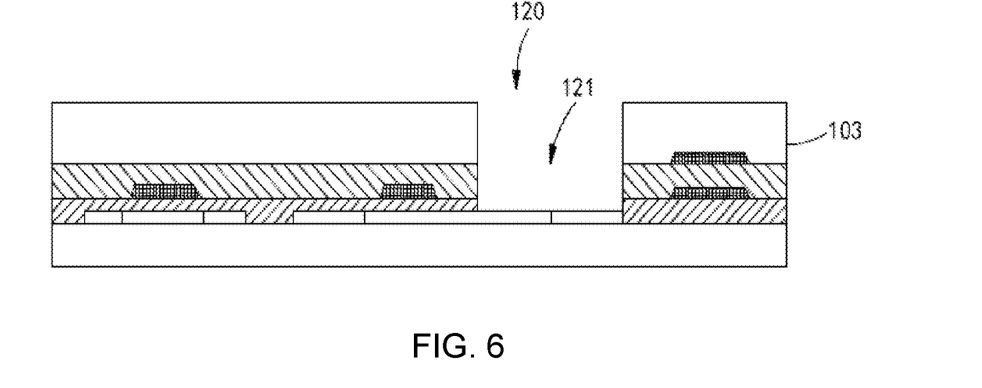

As shown in FIG. 6, an inorganic insulating layer 103 is sequentially deposited on the second metal layer 117 and covers the second metal layer 117. After the inorganic insulating layer 103 is formed, the fingerprint recognition area 120 of the display panel is etched to form a third through-hole 121. Specifically, the third through-hole 121 penetrates the first gate insulating layer, the second gate insulating layer, and the inorganic insulating layer, and exposes a part of the active layer. A radius of the third through-hole 121 can be determined according to actual requirements.

Figure 7:
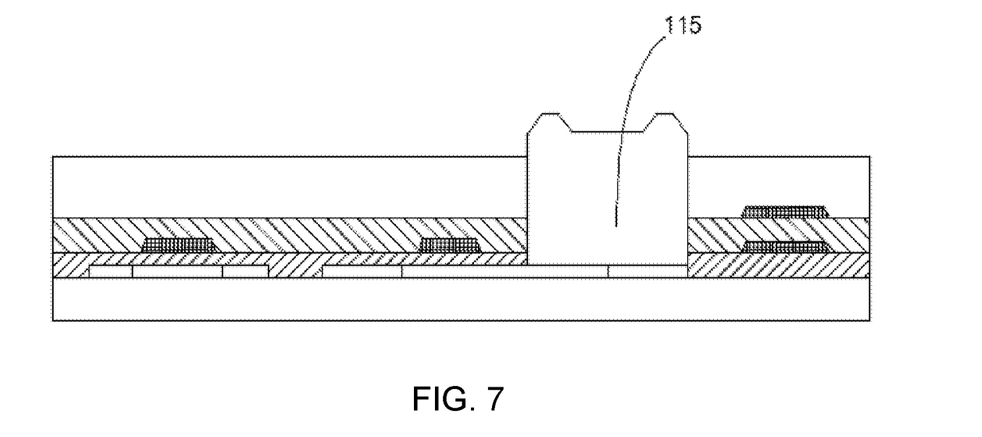

As shown in FIG. 7, after the third through-hole 121 is formed, a fingerprint recognition module 115 is disposed in the third through-hole 121. In the present embodiment, the fingerprint recognition module 115 is electrically connected to the corresponding active layer. A height of the fingerprint recognition module 115 can be greater than a height of an inorganic insulating film layer. Therefore, the fingerprint recognition module can receive more reflected light, thereby ensuring accuracy of fingerprint recognition and improving recognition efficiency. Because the fingerprint recognition module 115 has a greater height, a step structure is formed between the fingerprint recognition module 115 and the inorganic insulating layer.

Figure 8:
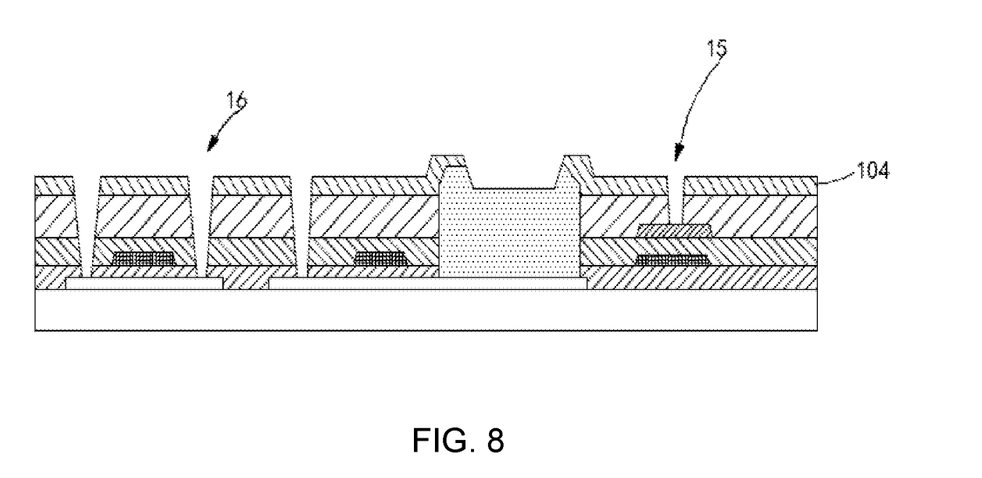

As shown in FIG. 8, other film layers are sequentially deposited. Specifically, a passivation layer 104 is deposited on the inorganic insulating layer. After that, positions on the passivation layer 104 respectively corresponding the active layer of the TFT and the second metal layer are etched, thereby forming a plurality of through-hole structures. Preferably, a first through-hole 15 and a second through-hole 16 are defined on film layers corresponding the second metal layer. Positions corresponding the fingerprint recognition module are etched to form the corresponding through-hole structures.

Figure 9:
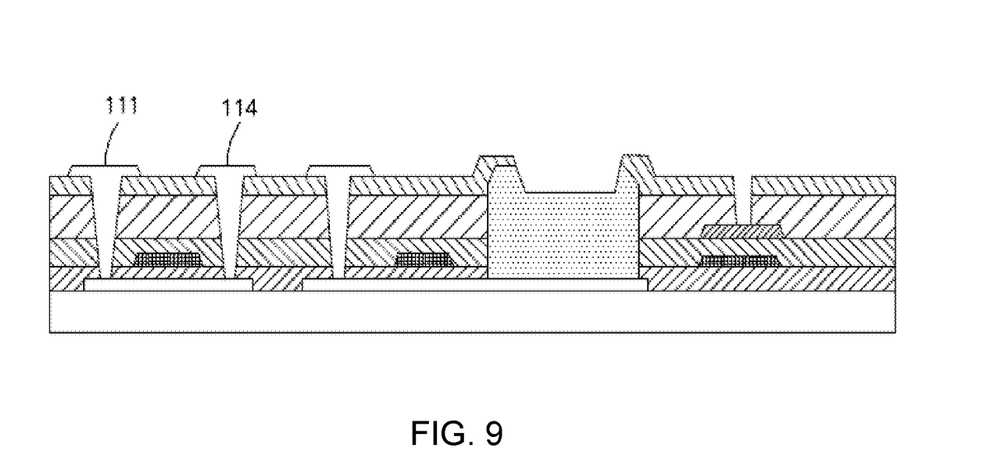

As shown in FIG. 9, a corresponding electrode is deposited on positions corresponding to the through-holes. After that, a source 111 and a drain 114 of the TFT are formed, respectively. The source 111 and the drain 114 are electrically connected to the active layer of the TFT by the corresponding through-hole structure.

S15: forming a planarization layer on the first passivation layer, etching the planarization layer to form a first through-hole, a second through-hole, and a third through-hole on the planarization layer, and forming a second electrode layer and a third electrode layer by deposition;

S16: depositing a first electrode layer on the planarization layer, wherein the first electrode layer passes the first through-hole and the storage capacitor and is electrically connected to the fingerprint recognition module;

S17: forming a passivation layer on the first electrode layer, and etching a position on the passivation layer corresponding to the second through-hole.

Figure 10:
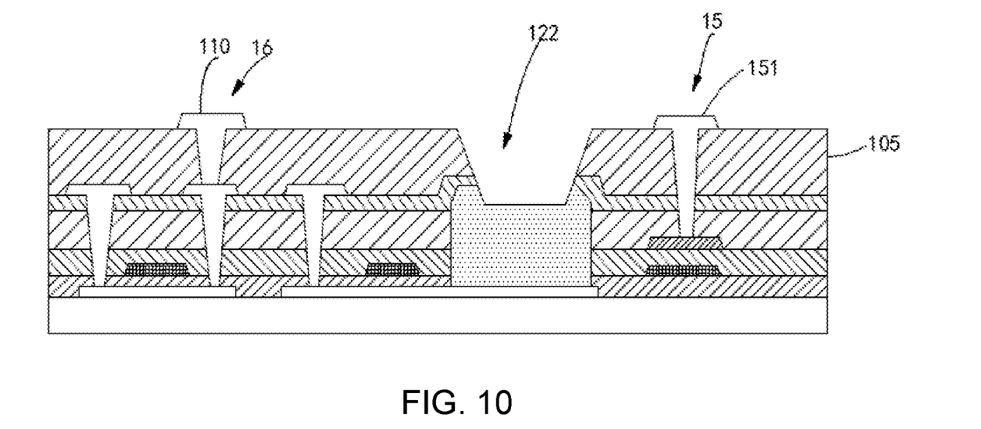

As shown in FIG. 10, a first planarization layer 105 is deposited on the passivation layer. After that, the planarization layer is etched to further form the first through-hole 15, a fourth through-hole 122, and the second through-hole 16. Furthermore, the second electrode layer 151 is disposed in the first through-hole 15, and the third electrode layer 110 is disposed in the second through-hole 16.

Figure 11:
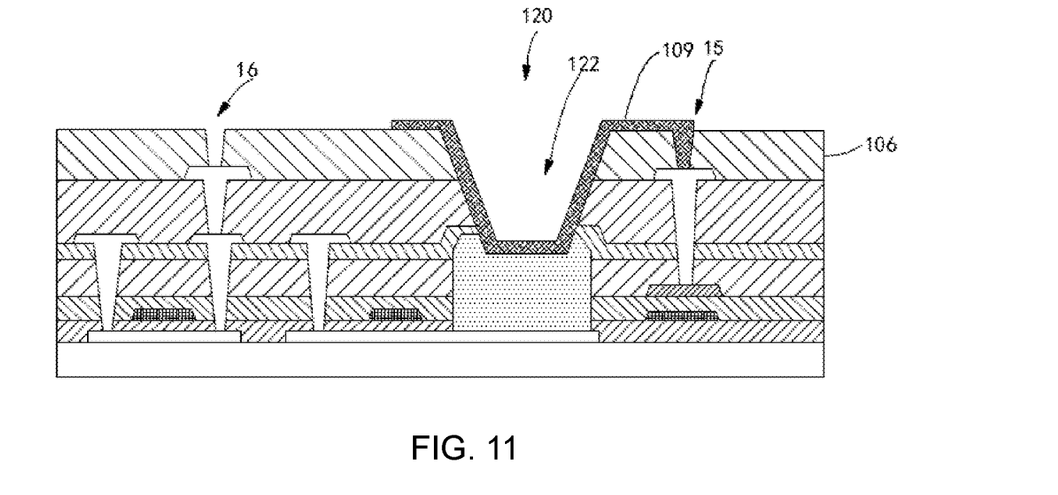

As shown in FIG. 11, a second planarization layer 106 and a first electrode layer 109 are formed sequentially, wherein the second planarization layer 106 is disposed on the first planarization layer, and the first electrode layer 109 is disposed on the fingerprint recognition area 120 of the display panel. The first electrode layer 109 is disposed along the fourth through-hole 122, and part of the first electrode layer 109 is electrically connected to the fingerprint recognition module in the third through-hole. Two ends of the first electrode layer 109 extend beyond the fourth through-hole 122 and extend outside the fourth through-hole 122. Furthermore, the first electrode layer 109 is electrically connected to the second electrode layer by the first through-hole 15. Thus, the fingerprint recognition module is conductive with the storage capacitor.

Figure 12:
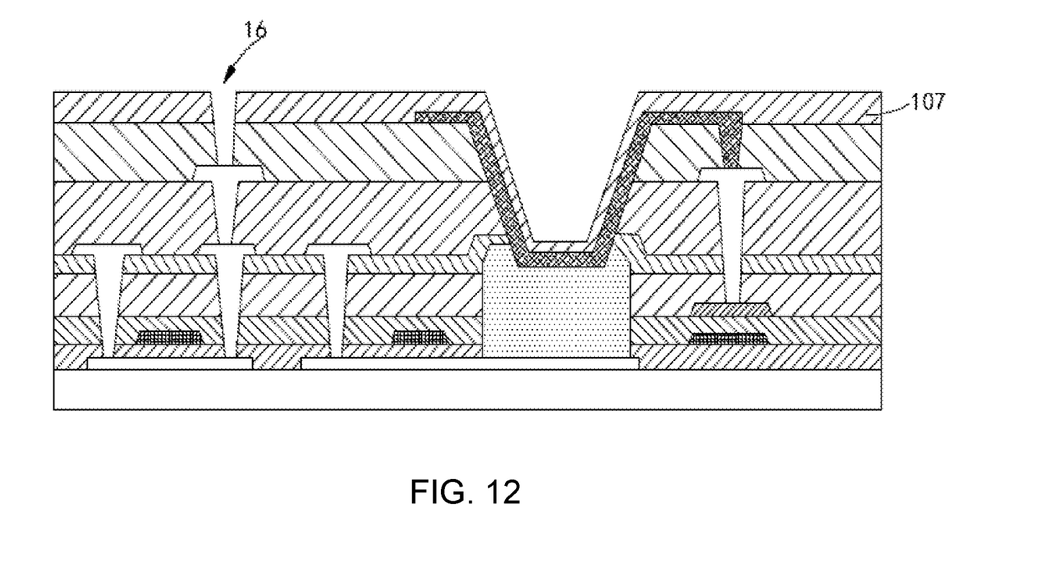

As shown in FIG. 12, a second passivation layer 107 is deposited on the second planarization layer, and the second passivation layer 107 is patterned to form the second through-hole 16.

Figure 13:
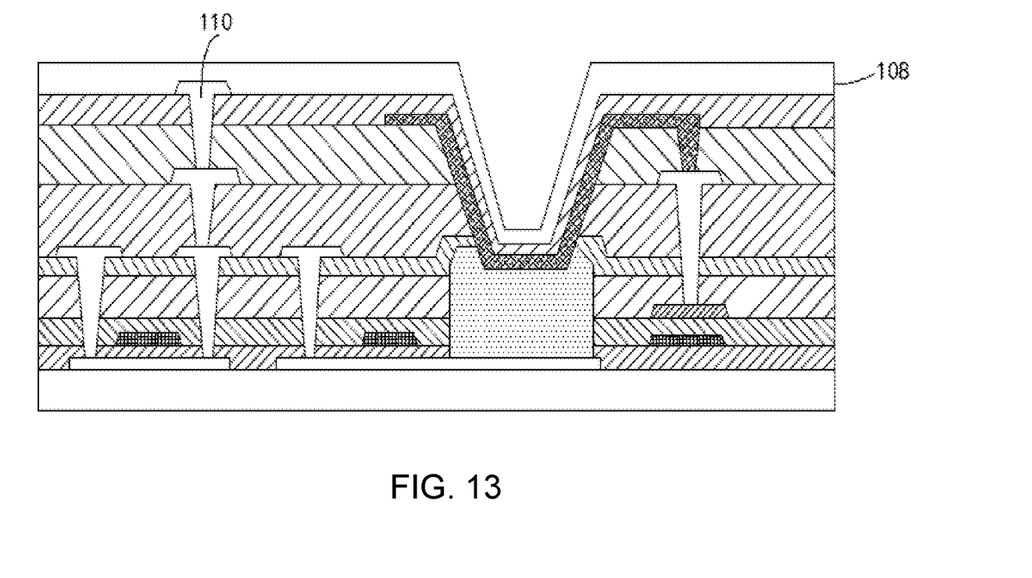

As shown in FIG. 13, after the second passivation is formed, a third electrode layer 110 is disposed in the second through-hole 16, and a third passivation layer 108 is deposited on the second passivation layer 107. The third passivation layer 108 covers the third electrode layer 110, and the third electrode layer 110 is electrically connected to the drain of the TFT by the second through-hole 16.

Finally, the display panel provided by the present is formed. When a great number of external LEDs is transferred to the display panel, a corresponding photoresist film layer can be deposited on the third passivation layer 108 first, and then the LEDs are attached to the corresponding photoresist film layer. Therefore, a transfer process is simple.

A structure of the array substrate of the present embodiment is more reasonable. The fingerprint recognition module is disposed in the TFT device layer in the array substrate of the display panel. Therefore, LEDs can be driven and controlled, and fingerprint recognition can be realized. The display panel has precise fingerprint recognition, fast response times, and diverse functions. Furthermore, the above-mentioned array substrate and display panel have simpler manufacturing processes and lower manufacturing costs.

Furthermore, an embodiment of the present disclosure also provides a display device. The display device includes the array substrate and the display panel provided by the above-mentioned embodiments. The display device not only has better display quality, but also can control LEDs to emit light. Furthermore, the display device has better fingerprint recognition performance, a simpler structure, and better overall performance.

The display panel and the manufacturing method thereof have been described in detail with embodiments provided by the present disclosure which illustrate principles and implementations thereof. However, the description of the above embodiments are only for helping to understand the technical solution of the present disclosure and core ideas thereof, and it is understood by those skilled in the art that many changes and modifications to the described embodiments can be carried out without departing from the scope and the spirit of the disclosure that is intended to be limited only by the appended claims.

What is claimed is:

1. A display panel, comprising:
a thin-film transistor (TFT) device layer, wherein the TFT device layer comprises a source, a drain, a gate, and an active layer of a TFT;
a planarization layer, wherein the planarization layer is disposed on the TFT device layer;
a first electrode layer, wherein the first electrode layer is disposed on the planarization layer; and
a storage capacitor, wherein the storage capacitor is disposed on a side of the TFT device layer;
wherein the display panel further comprises a fingerprint recognition module, the fingerprint recognition module comprises a sensing electrode layer, the sensing electrode layer and the active layer are disposed on a same layer, the storage capacitor is electrically connected to the fingerprint recognition module by the first electrode layer, a material of the first electrode layer is indium tin oxide (ITO), and the fingerprint recognition module comprises at least one of a light fingerprint recognition device or an ultrasonic fingerprint recognition device, wherein the fingerprint recognition module further comprises a photosensitive electrode layer, an end of the photosensitive electrode layer is connected to the first electrode layer, and another end of the photosensitive electrode layer is connected to the sensing electrode layer; wherein the photosensitive electrode layer comprises a first photosensitive electrode, a second photosensitive electrode, and a connecting layer, the first photosensitive electrode is disposed on the connecting layer, and the second photosensitive electrode is disposed on the first photosensitive electrode, the first photosensitive electrode is electrically connected to the sensing electrode layer by the connecting layer, and the second photosensitive electrode is electrically connected to the first electrode layer;
wherein a width of the connecting layer is less than a width of the first photosensitive electrode, and the width of the first photosensitive electrode is less than or equal to a width of the second photosensitive electrode.

2. The display panel of claim 1, wherein the display panel further comprises a second electrode layer and a first through-hole, the first through-hole is defined on a layer corresponding to the storage capacitor, and the second electrode layer is disposed in the first through-hole.

3. The display panel of claim 2, wherein an end of the second electrode layer is electrically connected to the first electrode layer, and another end of the second electrode layer is electrically connected to an electrode of the storage capacitor.

4. The display panel of claim 1, wherein the storage capacitor comprises a first metal layer and a second metal layer which are disposed on different layers, and a projection of the first metal layer overlaps with a projection of the second metal layer.

5. The display panel of claim 4, wherein the first metal layer and the gate of the TFT are formed by a same etching process.

6. The display panel of claim 1, wherein the display panel further comprises a light-enhancing layer, and the light-enhancing layer is surrounding the fingerprint recognition module.

7. A display panel, comprising:
a thin-film transistor (TFT) device layer, wherein the TFT device layer comprises a source, a drain, a gate, and an active layer of a TFT;
a planarization layer, wherein the planarization layer is disposed on the TFT device layer;
a first electrode layer, wherein the first electrode layer is disposed on the planarization layer; and
a storage capacitor, wherein the storage capacitor is disposed on a side of the TFT device layer;
wherein the display panel further comprises a fingerprint recognition module, the fingerprint recognition module comprises a sensing electrode layer, the sensing electrode layer and the active layer are disposed on a same layer, and the storage capacitor is electrically connected to the fingerprint recognition module by the first electrode layer, wherein the fingerprint recognition module further comprises a photosensitive electrode layer, an end of the photosensitive electrode layer is connected to the first electrode layer, and another end of the photosensitive electrode layer is connected to the sensing electrode layer; wherein the photosensitive electrode layer comprises a first photosensitive electrode, a second photosensitive electrode, and a connecting layer, the first photosensitive electrode is disposed on the connecting layer, and the second photosensitive electrode is disposed on the first photosensitive electrode, the first photosensitive electrode is electrically connected to the sensing electrode layer by the connecting layer, and the second photosensitive electrode is electrically connected to the first electrode layer;
wherein a width of the connecting layer is less than a width of the first photosensitive electrode, and the width of the first photosensitive electrode is less than or equal to a width of the second photosensitive electrode.

8. The display panel of claim 7, wherein the display panel further comprises a second electrode layer and a first through-hole, the first through-hole is defined on a layer corresponding to the storage capacitor, and the second electrode layer is disposed in the first through-hole.

9. The display panel of claim 8, wherein an end of the second electrode layer is electrically connected to the first electrode layer, and another end of the second electrode layer is electrically connected to an electrode of the storage capacitor.

10. The display panel of claim 7, wherein the storage capacitor comprises a first metal layer and a second metal layer which are disposed on different layers, and a projection of the first metal layer overlaps with a projection of the second metal layer.

11. The display panel of claim 10, wherein the first metal layer and the gate of the TFT are formed by a same etching process.

12. The display panel of claim 7, wherein the display panel further comprises a light-enhancing layer, and the light-enhancing layer is surrounding the fingerprint recognition module.

13. The display panel of claim 7, wherein the sensing electrode layer is formed from the active layer.

14. The display panel of claim 13, wherein the active layer comprises a lightly doped region and a heavily doped region adjacent to the lightly doped region, and the active layer corresponding to the heavily doped region forms the sensing electrode layer.

15. The display panel of claim 7, wherein the display panel further comprises a third electrode layer and a second through-hole, and the third electrode layer is electrically connected to the drain of the TFT by the second through-hole.

16. The display panel of claim 15, wherein the display panel further comprises a light-emitting diode (LED) disposed on the planarization layer and connected to the third electrode layer.

* * * * *